(12) United States Patent
Prushinskiy et al.

(10) Patent No.: US 9,041,047 B2
(45) Date of Patent: May 26, 2015

(54) ORGANIC LIGHT EMITTING DIODE DISPLAY AND METHOD FOR MANUFACTURING THE SAME

(75) Inventors: Valeriy Prushinskiy, Yongin (KR); Won-Sik Hyun, Yongin (KR); Heung-Yeol Na, Yongin (KR); Min-Soo Kim, Yongin (KR); Beohm-Rock Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 13/535,283

(22) Filed: Jun. 27, 2012

(65) Prior Publication Data

US 2013/0146938 A1   Jun. 13, 2013

(30) Foreign Application Priority Data

Dec. 9, 2011   (KR) .......................... 10-2011-0131985

(51) Int. Cl.
*H01L 51/52*   (2006.01)

(52) U.S. Cl.
CPC ........ *H01L 51/5246* (2013.01); *H01L 51/5259* (2013.01)

(58) Field of Classification Search
CPC ........... B81B 7/0038; B81C 2203/019; G02B 26/001
USPC .................................. 257/415, 433; 438/127
See application file for complete search history.

(56) References Cited

U.S. PATENT DOCUMENTS

| | | | |
|---|---|---|---|
| 5,304,419 A | 4/1994 | Shores | |
| 5,591,379 A | 1/1997 | Shores | |
| 5,686,360 A | 11/1997 | Harvey, III et al. | |
| 5,874,804 A | 2/1999 | Rogers | |
| 7,255,823 B1 | 8/2007 | Guenther et al. | |
| 2009/0189230 A1* | 7/2009 | Palmateer et al. | ............ 257/415 |

FOREIGN PATENT DOCUMENTS

| | | |
|---|---|---|
| JP | 07-169567 | 7/1995 |
| JP | 2000-123968 A | 4/2000 |
| KR | 10-2002-0044891 A | 6/2002 |
| KR | 10-0626087 B1 | 9/2006 |

* cited by examiner

*Primary Examiner* — Kenneth Parker
*Assistant Examiner* — Bo Fan
(74) *Attorney, Agent, or Firm* — Christie, Parker & Hale, LLP

(57) ABSTRACT

An exemplary embodiment described technology relates generally to an organic light emitting diode (OLED) display and a manufacturing method thereof. The organic light emitting diode (OLED) display according to an exemplary embodiment includes: a substrate; an encapsulation member; an organic light emitting element between the substrate and the encapsulation member; a middle sealing member including one side disposed between the substrate and the encapsulation member and another side extended from the one side to be bent and enclosing an edge of the encapsulation member; a first sealant sealing and combining the one side of the middle sealing member and the substrate to each other; a second sealant sealing and combining the other side of the middle sealing member and the encapsulation member to each other; and a getter at the one side of the middle sealing member and the encapsulation member.

6 Claims, 9 Drawing Sheets

ORGANIC LIGHT EMITTING DIODE DISPLAY AND METHOD FOR MANUFACTURING THE SAME

CROSS-REFERENCE TO RELATED PATENT APPLICATION

This application claims priority to and the benefit of Korean Patent Application No. 10-2011-0131985 filed in the Korean Intellectual Property Office on Dec. 9, 2011, the entire content of which is incorporated herein by reference.

BACKGROUND

1. Field

An exemplary embodiment described technology relates generally to an organic light emitting diode (OLED) display and a manufacturing method thereof.

2. Description of the Related Art

An organic light emitting diode (OLED) display has a self-emissive characteristic, and thus, unlike a liquid crystal display, does not need a separate light source. Therefore, the OLED display can be thin (slim) in thickness and light in weight. In addition, since the OLED display has high-quality characteristics such as low power consumption, high luminance, fast reaction time, and the like, the OLED display is drawing attention as a next generation display for a portable electronic device.

The organic light emitting diode (OLED) display includes a plurality of organic light emitting elements (organic light emitting diodes) having a hole injection electrode, an organic emission layer, and an electron injection electrode. Light occurs by energy that is generated when excitons that are generated by coupling of electrons and holes within the organic emission layer drop from an exited state to a ground state, whereby the OLED display displays an image.

However, the organic emission layer is sensitive to (reacts to) an external factor such as moisture or oxygen. Accordingly, if the organic emission layer is exposed to moisture or oxygen, the quality of the organic light emitting diode (OLED) display is deteriorated. Therefore, to protect the organic light emitting element and to prevent the moisture or oxygen from penetrating into the organic emission layer, an encapsulation substrate is combined and sealed with the substrate formed with the organic light emitting element through a sealing process, or a thin film encapsulation layer is formed on the organic light emitting element.

However, the moisture or oxygen may still penetrate through a connection interface where the encapsulation member and the substrate are connected, and the size (width) of a sealing region must be increased to prevent this penetration, which is a problem. If the sealing region is increased (widened), a non-display area is unnecessarily increased in the organic light emitting diode (OLED) display.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed toward an organic light emitting diode (OLED) display and a manufacturing method thereof in which an inner space formed with an organic light emitting element is sealed.

Aspects of embodiments of the present invention are directed an organic light emitting diode (OLED) display and a manufacturing method thereof with an easy manufactured process while effectively suppressing penetration of moisture and/or oxygen.

According to an exemplary embodiment, an organic light emitting diode (OLED) display includes: a substrate; an encapsulation member; an organic light emitting element between the substrate and the encapsulation member; a middle sealing member including one side between the substrate and the encapsulation member and another side extended from the one side to be bent and enclosing an edge of the encapsulation member; a first sealant sealing and combining the one side of the middle sealing member and the substrate to each other; a second sealant sealing and combining the other side of the middle sealing member and the encapsulation member to each other; and a getter at the one side of the middle sealing member and the encapsulation member.

The getter may be positioned closer to the organic light emitting element than the first sealant.

The getter may maintain a vacuum state of a space between the substrate and the encapsulation member.

According to another exemplary embodiment, an organic light emitting diode (OLED) display includes: a substrate; an encapsulation member; an organic light emitting element between the substrate and the encapsulation member; a middle sealing member with an embayment structure and having an opening facing toward the organic light emitting element, the middle sealing member comprising one side facing the substrate and another side facing the encapsulation member; a first sealant sealing and combining the one side of the middle sealing member and the substrate to each other; a second sealant sealing and combining the other side of the middle sealing member and the encapsulation member to each other; and a getter filled between the one side and the other side of the middle sealing member.

The getter may be positioned closer to the organic light emitting element than the first sealant and the second sealant.

The getter may maintain a vacuum state of a space between the substrate and the encapsulation member.

A manufacturing method according to an exemplary embodiment includes: forming an organic light emitting element on a substrate; sealing and combining one side of a middle sealing member to the substrate by using a first sealant; coating a getter on the middle sealing member; disposing an encapsulation member on the getter; coating a second sealant on the encapsulation member; and bending another side of the middle sealing member extended from the one side of the middle sealing member to close an edge of the encapsulation member, and sealing and combining the other side of the middle sealing member and the encapsulation member through the second sealant.

The getter may be positioned closer to the organic light emitting element than the first sealant.

The getter may maintain a vacuum state of a space between the substrate and the encapsulation member.

The getter may be coated in a liquid state.

The middle sealing member may be bent to have an "L" shape structure, and the one side of the middle sealing member is a bottom side of the "L" shape structure, the bottom side being combined with the substrate through the first sealant.

A manufacturing method of an organic light emitting diode (OLED) display according to another exemplary embodiment includes: forming an organic light emitting element on a substrate; coating a first sealant on the substrate; forming a middle sealing member having an embayment structure with a "U" shape; filling a space between one side of the middle sealing member and another side of the middle sealing member defining an opening of the middle sealing member with a getter; sealing and combining the one side of the middle sealing member to the substrate by using the first sealant; coating a second sealant on the other side of the middle sealing member; and sealing and combining the other side of the middle sealing member and an encapsulation member by using the second sealant.

The getter may be positioned closer to the organic light emitting element than the first sealant and the second sealant.

The getter may maintain a vacuum state of a space between the substrate and the encapsulation member.

The getter may be coated in a liquid state.

According to exemplary embodiments, the organic light emitting diode (OLED) display may effectively suppress the penetration of moisture and oxygen.

Also, the organic light emitting diode (OLED) display may be effectively and easily manufactured.

DETAILED DESCRIPTION

Figure 1:
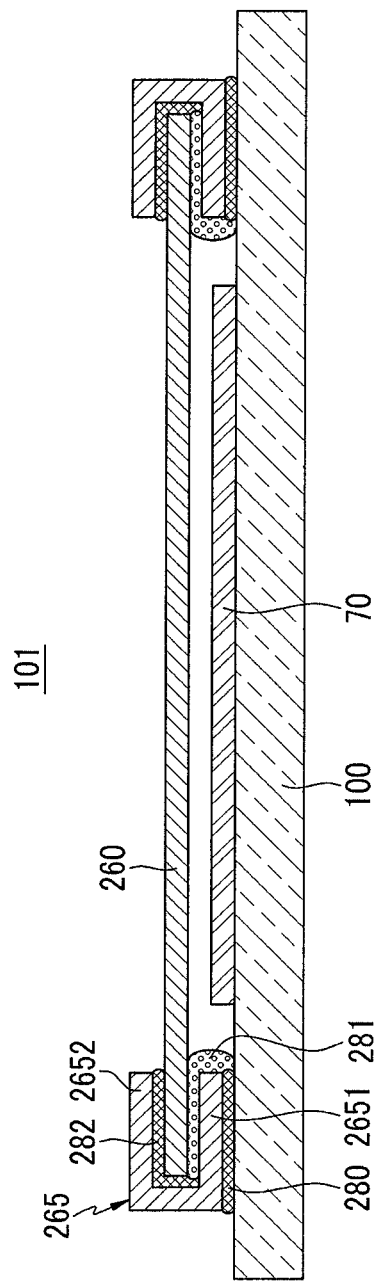
FIG. 1 is a cross-sectional view of an organic light emitting diode (OLED) display according to an exemplary embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

Further, in the embodiments, like reference numerals designate like elements throughout the specification.

The drawings are schematic and not proportionally scaled down. Relative scales and ratios in the drawings are enlarged or reduced for the purpose of accuracy and/or convenience, and the scales are random and not limited thereto. In addition, like reference numerals designate like structures, elements, or parts throughout the specification. It will be understood that when an element is referred to as being "on" another element, it can be directly on another element or intervening elements may be present therebetween.

Exemplary embodiments represent ideal exemplary embodiments in detail. As a result, suitable modifications are expected. Accordingly, exemplary embodiments are not limited to specific shapes of shown regions, and for example, also include modifications of the shape by manufacturing.

An organic light emitting diode (OLED) display 101 according to an exemplary embodiment will be described with reference to FIG. 1.

As shown in FIG. 1, an organic light emitting diode (OLED) display 101 includes a substrate 100, an organic light emitting element 70, an encapsulation member 260, a middle sealing member 265, a first sealant 280, a second sealant 282, and a getter 281.

The substrate 100 may be made of various suitable kinds of materials known to those skilled in the art, such as glass, quartz, ceramic, and plastic. Also, the organic light emitting element 70 is formed on the substrate 100. The organic light emitting element (diode) 70 emits light and thus the OLED display 101 displays an image.

The encapsulation member 260 is arranged to face the substrate 100 with the organic light emitting element 70 interposed therebetween. That is, the encapsulation member 260 covers and protects the organic light emitting element 70. The encapsulation member 260 may be made of various suitable kinds of materials known to those skilled in the art, such as glass, quartz, ceramic, plastic, or like the substrate 100. Also, the encapsulation member 260 may be made of the same material as the substrate 100, or may be made of a different material.

The middle sealing member 265 is positioned at the substrate 100 to enclose the organic light emitting element 70 and is positioned at a region where the substrate 100 and the encapsulation member 260 are coupled to each other.

In FIG. 1, one side 2651 of the middle sealing member 265 is disposed between the substrate 100 and the encapsulation member 260, and the other side 2652 extended from the one side 2651 is bent to enclose the edge of the encapsulation member 260. That is, the cross-sectional of the middle sealing member 265 is formed with a "U" shape. Also, an opening of the middle sealing member 265 is disposed to face toward the organic light emitting element 70, and an end of the encapsulation member 260 has a structure that is inserted inside the opening of the middle sealing member 265.

The middle sealing member 265 may be made of a flexible material, and may be made of a material having an excellent penetration suppression force for moisture or oxygen. For example, the middle sealing member 265 may be made of a material such as PMMA (poly methyl methacrylate), however the present invention is not limited thereto.

The first sealant 280 is disposed between the one side 2651 of the middle sealing member 265 (disposed between the substrate 100 and the encapsulation member 260) and the substrate 100, thereby sealing-coupling the middle sealing member 265 and the substrate 100 to each other.

The second sealant 282 is disposed between the other side 2652 of the middle sealing member 265 enclosing the end of the encapsulation member 260 and the encapsulation member 260, thereby sealing-coupling the middle sealing member 265 and the encapsulation member 260.

The first sealant 280 and the second sealant 282 may be made of various suitable materials that are known to those skilled in the art.

The getter 281 is disposed between the one side 2651 of the middle sealing member 265 and the encapsulation member 260. The getter 281 may perform a function of maintaining a vacuum state of a space between the substrate 100 and the encapsulation member 260.

In FIG. 1, the getter 281 is closer to the organic light emitting element 70 than the first sealant 280. In more detail, a portion of the getter 281 is protruded toward the organic light emitting element 70. Also, the protruded getter 281 is formed to respectively contact the substrate 100 and the encapsulation member 260. Accordingly, the moisture or oxygen penetrated into the interface between the first sealant 280 and the substrate 100 may be secondarily prevented (blocked and/or absorbed) by the getter 281.

Also, in FIG. 1, the adhesion area between the second sealant 282 and the encapsulation member 260 is relatively wide and bent such that the organic light emitting diode (OLED) display 101 has a structure that makes it difficult for moisture or oxygen to penetrate into the interface between the second sealant 282 and the encapsulation member 260.

By this constitution, the organic light emitting diode (OLED) display 101 of FIG. 1 may effectively suppress the penetration of moisture and/or oxygen. Particularly, the organic light emitting diode (OLED) display 101 may effectively suppress the penetration of moisture or oxygen according to the interlayer interface in the lateral direction.

Also, according to FIG. 1, the organic light emitting diode (OLED) display 101 may be easily manufactured.

Figure 2:
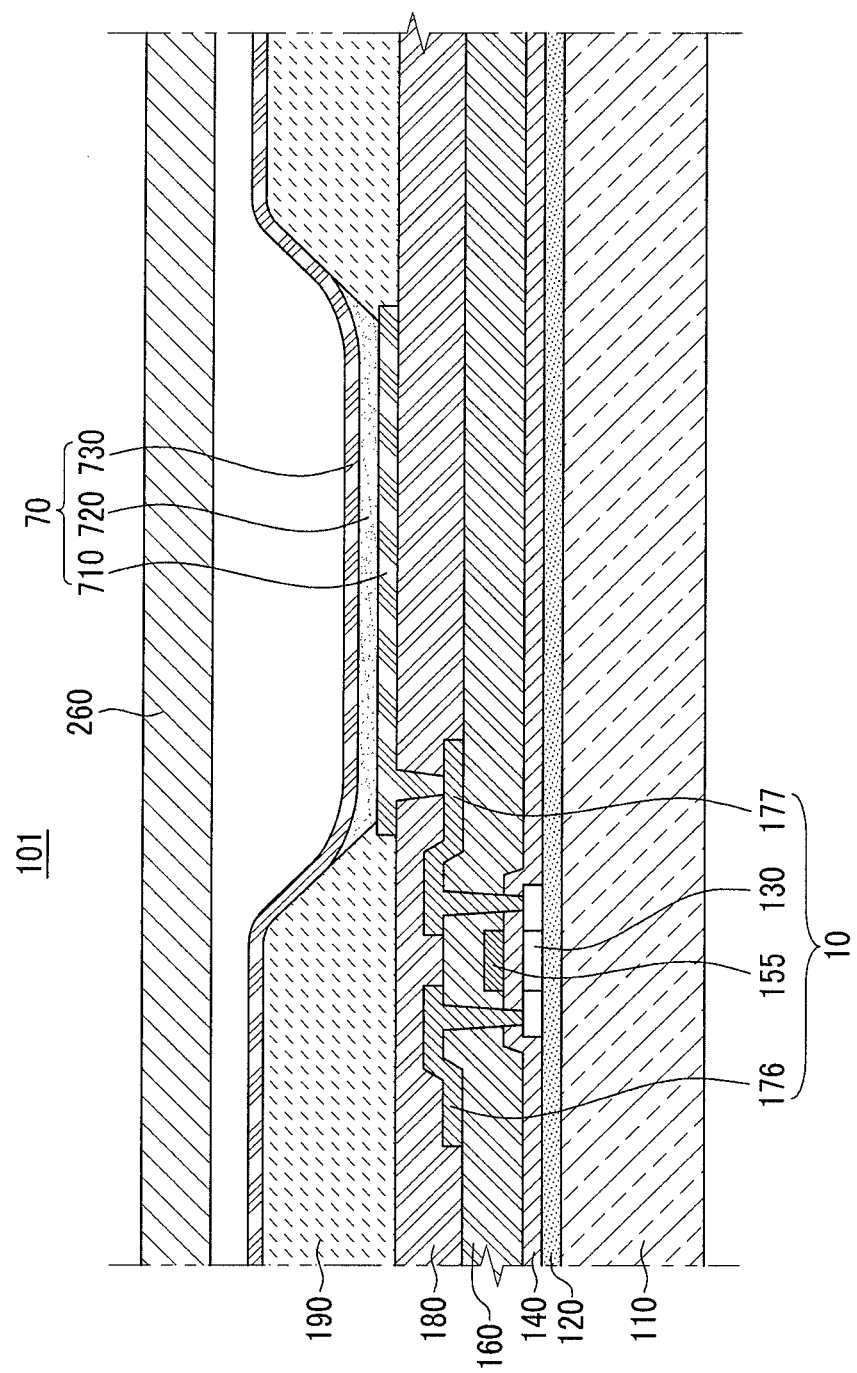
FIG. 2 is an enlarged cross-sectional view focusing on an organic light emitting element of FIG. 1.

Next, referring to FIG. 2, in the organic light emitting diode (OLED) display 101 according to one embodiment, the organic light emitting element 70 is formed on the substrate 100 and a thin film transistor 10 is formed to drive the organic light emitting element 70.

The thin film transistor 10 includes a semiconductor layer 130, a gate electrode 155, a source electrode 176, and a drain electrode 177.

In one embodiment, the semiconductor layer 130 is formed of a polysilicon layer. However, the present invention is not limited thereto. For example, the semiconductor layer 130 may be formed of an amorphous silicon layer or an oxide semiconductor.

The gate electrode 155 is partially disposed on a region of the semiconductor layer 130, and a gate insulating layer 140 is disposed between the gate electrode 155 and the semiconductor layer 130. The gate electrode 155 may be formed of various suitable conducting materials known to a person skilled in the art. The gate insulating layer 140 may include one of tetra ethyl ortho silicate (TEOS), silicon nitride (SiNx), and silicon oxide (SiO2). For example, the gate insulating layer 140 may be made of a dual-layered structure including a nitride silicon layer having a thickness of 40 nm and the TEOS having a thickness of 80 nm that are sequentially deposited. However, in the present invention, the gate insulating layer 140 is not limited by the above-described constitutions.

The source electrode 176 and the drain electrode 177 respectively contact the semiconductor layer 130. The source electrode 176 and the drain electrode 177 may be formed of various suitable conducting materials known to a person skilled in the art. The source electrode 176 and the drain electrode 177 are separated from each other and are disposed to be insulated from the gate electrode 155. The interlayer insulating layer 160 may be disposed between the source electrode 176 and the drain electrode 177. The interlayer insulating layer 160 may be formed of various suitable insulating materials known to a person skilled in the art.

The organic light emitting element 70 includes a pixel electrode 710 connected to the drain electrode 177 of the thin film transistor 10, an organic emission layer 720 formed on the pixel electrode 710, and a common electrode 730 formed on the organic emission layer 720. Also, a pixel definition layer 190 having an opening exposing a portion of the pixel electrode 710 and defining a light emitting region may be included. The organic emission layer 720 may emit light within the opening of the pixel definition layer 190.

Also, in the present invention, the structures of the thin film transistor 10 and the organic light emitting element 70 are not limited to the structures shown in FIG. 2. The thin film transistor 10 and the organic light emitting element (diode) 70 can have various suitable structures of a range that can be easily modified by a person skilled in the art.

Also, the organic light emitting diode (OLED) display 101 further includes a barrier layer 120 disposed between the thin film transistor 10 and the substrate 100. In further detail, the barrier layer 120 may be disposed between the semiconductor layer 130 and the substrate 100. For example, the barrier layer 120 may have a single-layered structure in which a single layer of silicon nitride (SiNx) is formed, or a double-layered structure of silicon nitride (SiNx) and silicon oxide (SiO2). The barrier layer 120 functions to prevent permeation of unnecessary components such as an impure element or moisture, and makes the surface flat. However, the barrier layer 120 is not a required constituent, and it may be omitted according to the type and process conditions of the substrate 100.

Next, a manufacturing method of an organic light emitting diode (OLED) display 101 according to an exemplary embodiment will be described with reference to FIG. 3 to FIG. 6.

First, a substrate 100 formed of a material such as glass, quartz, or ceramic is prepared. Also, an organic light emitting element 70 (referring to FIG. 1) is formed on the substrate 100.

Figure 3:
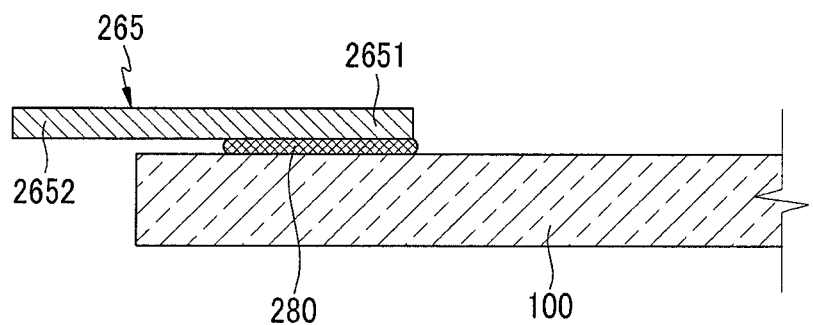
FIG. 3 to FIG. 6 are cross-sectional views sequentially showing a manufacturing process of the organic light emitting diode (OLED) display of FIG. 1.

Next, as shown in FIG. 3, the first sealant 280 for enclosing the organic light emitting element 70 is formed to enclose an edge portion of the substrate 100. Also, one side 2651 of the middle sealing member 265 is sealed-coupled to the substrate 100 by using the first sealant 280.

Figure 4:
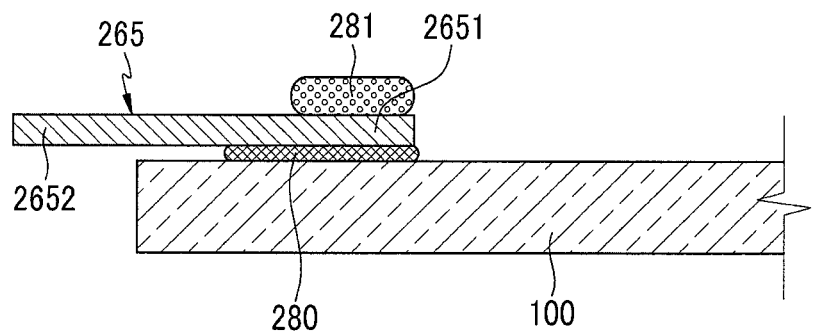

Next, as shown in FIG. 4, a getter 281 is coated on the one side 2651 of the middle sealing member 265. That is, the getter 281 is coated over the region where the middle sealing member 265 and the substrate 100 are connected by the first sealant 280.

Figure 5:
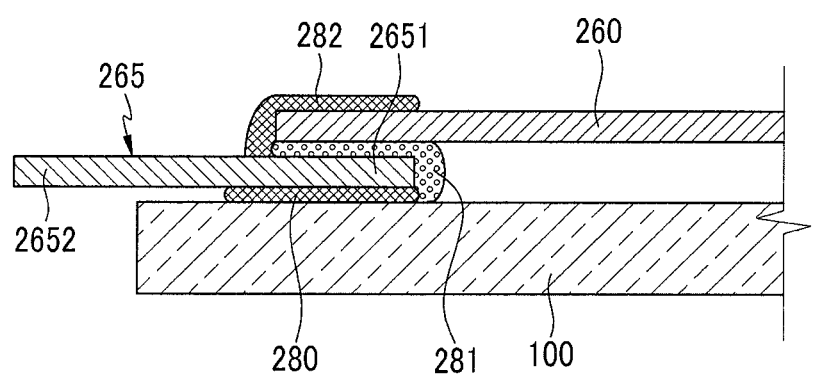

Next, as shown in FIG. 5, an encapsulation member 260 is disposed on the getter 281. Also, a second sealant 282 is coated on the encapsulation member 260. In more detail, the second sealant 282 is coated on the region where the middle sealing member 265 and the substrate 100 are connected by the first sealant 280. The getter 281 may be coated in a liquid state.

Next, the other side 2652 extended from the one side 2651 of the middle sealing member 265 is bent, thereby enclosing an edge of the encapsulation member 260. The other side 2652 of the middle sealing member 265 and the encapsulation member 260 are sealed-coupled through the second sealant 282 coated on the encapsulation member 260. Accordingly, the substrate 100 and the encapsulation member 260 are sealed-coupled, thereby forming a sealing space between the substrate 100 and the encapsulation member 260.

At this time, the getter 281 is disposed between the one side 2651 of the middle sealing member 265 and the encapsulation member 260, and partially protrudes in a direction toward the organic light emitting element 70 in the formation process in which the substrate 100 and the encapsulation member 260 are sealed-combined. Accordingly, the getter 281 is positioned closer to the organic light emitting element 70 than the first sealant 280. Accordingly, the moisture or oxygen having penetrated into the interface between the first sealant 280 and the substrate 100 may be secondarily prevented by the getter 281. Further, the getter 281 may maintain the vacuum state of the space between the substrate 100 and the encapsulation member 260.

Here, the above-described manufacturing method of the organic light emitting diode (OLED) display 101 may easily manufacture the organic light emitting diode (OLED) display 101 while effectively suppressing the penetration of the moisture and oxygen.

Next, a manufacturing method of an organic light emitting diode (OLED) display 101 according to another exemplary embodiment will be described with reference to FIG. 7 to FIG. 10.

Firstly, a substrate 100 formed of a material such as glass, quartz, or ceramic is prepared. Also, an organic light emitting element 70 (shown in FIG. 1) is formed on the substrate 100.

Figure 7:
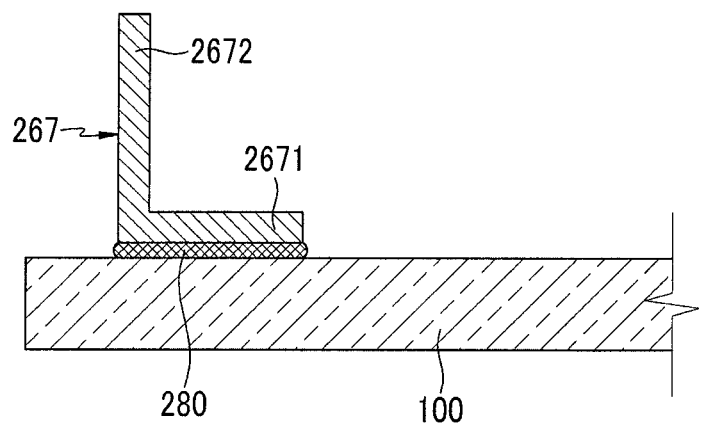
FIG. 7 to FIG. 10 are cross-sectional views sequentially showing another manufacturing process of an organic light emitting diode (OLED) display of FIG. 1.

Next, as shown in FIG. 7, one side 2671 of the middle sealing member 267 formed with an "L" shape (i.e., to have an "L" shape structure) by bending the middle portion 267 (and, e.g., a bottom side of the "L" shape structure, i.e., the one side 2671) is sealed and combined with the substrate 100 through a first sealant 280.

Figure 8:
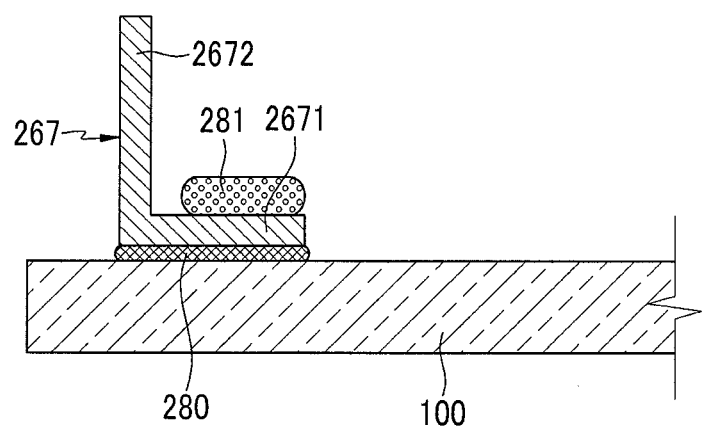

Next, as shown in FIG. 8, the getter 281 is coated on the one side 2671 of the middle sealing member 267. That is, the getter 281 is coated over the region where the middle sealing member 267 and the substrate 100 are combined by the first sealant 280. The getter 281 may be coated in a liquid state. At this time, the middle sealing member 267 of the "L" shape may prevent (block) the getter 281 coated in the liquid state from flowing outside the substrate 100. That is the getter 281 may be more stably coated.

Figure 9:
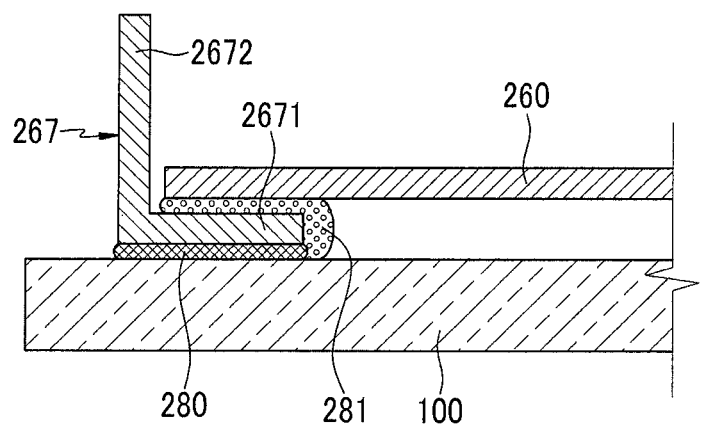

Next, as shown in FIG. 9, the encapsulation member 260 is disposed on the getter 281. In this process, the middle sealing member 267 of the "L" shape may prevent (block) the getter 281 receiving the pressure when disposing the encapsulation member 260 from flowing outside the substrate 100.

Figure 10:
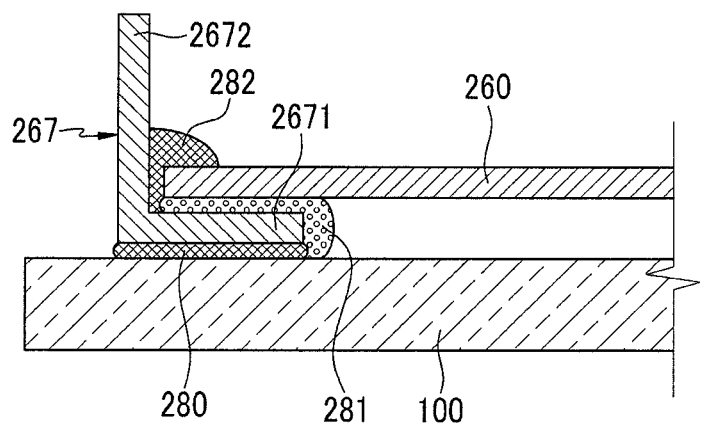

Next, as shown in FIG. 10, the second sealant 282 is coated on the encapsulation member 260. The second sealant 282 is coated on the region where the middle sealing member 267 and the substrate 100 are combined by the first sealant 280. By the middle sealing member 267 of the "L" shape, the second sealant 282 may also be further stably coated.

Figure 6:
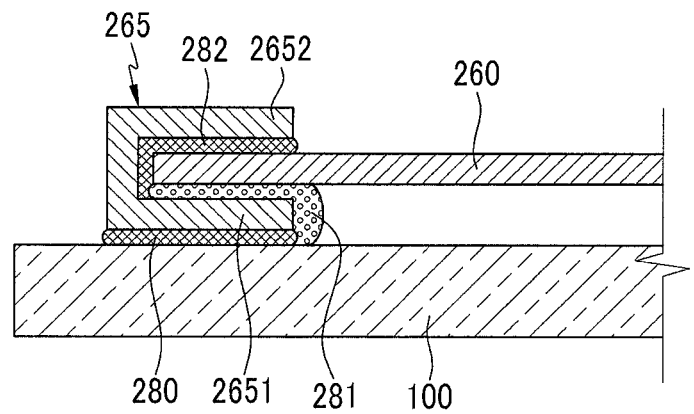

Next, the other side 2672 extended from the one side 2671 of the middle sealing member 267 (bent with the "L" shape) is folded, thereby enclosing the edge of the encapsulation member 260. Also, through the second sealant 282 coated on the encapsulation member 260, as shown in FIG. 6, the other side 2672 of the middle sealing member 267 and the encapsulation member 260 are sealed and combined.

Here, the described manufacturing method of the organic light emitting diode (OLED) display 101 of FIGS. 7 to 10 may easily and stably manufacture the organic light emitting diode (OLED) display 101 while effectively suppressing the penetration of the moisture and oxygen.

Next, an organic light emitting diode (OLED) display 102 according to another exemplary embodiment will be described with reference to FIG. 11.

Figure 11:
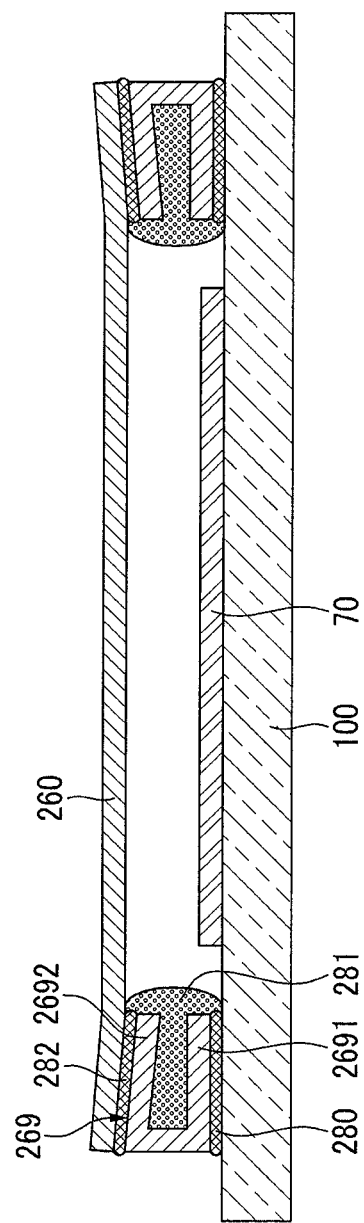
FIG. 11 is a cross-sectional view of an organic light emitting diode (OLED) display according to another exemplary embodiment.

As shown in FIG. 11, in the organic light emitting diode (OLED) display 102, a substrate 100 and an encapsulation member 260 are respectively arranged to face an organic light emission element 70.

A middle sealing member 269 is positioned at an edge portion of the substrate 100 to enclose the organic light emitting element 70, and is positioned at the region where the substrate 100 and the encapsulation member 260 are combined to each other.

In FIG. 11, the middle sealing member 269 has an embayment structure like a "U" shape, and the opening is disposed to face toward the organic light emitting element 70. Also, one side 2691 of the middle sealing member 269 faces the substrate 100, and the other side 2692 faces the encapsulation member 260. That is, in FIG. 1, the end of the encapsulation member 260 is not inserted inside the opening of the middle sealing member 269.

The first sealant 280 is disposed between the one side 2691 of the middle sealing member 269 and the substrate 100, thereby sealing-combining the middle sealing member 269 and the encapsulation member 260.

The second sealant 282 is disposed between the other side 2692 of the middle sealing member 269 and the encapsulation member 260, thereby sealing-combining the middle sealing member 269 and the substrate 100.

The getter 281 fills between the one side 2691 of the middle sealing member 269 and the other side 2692. The getter 281 may perform the function of maintaining the vacuum state of the space between the substrate 100 and the encapsulation member 260. Also, a portion of the getter 281 is protruded toward the organic light emitting element 70. Further, the protruded getter 281 is formed to respectively contact the substrate 100 and the encapsulation member 260. Accordingly, the getter 281 is positioned closer to the organic light emitting element 70 than the first sealant 280 and the second sealant 282. Therefore, the getter 281 may secondarily prevent the moisture or oxygen from penetrating into the interface between the first sealant 280 and the substrate 100 or the interface between the second sealant 282 and the encapsulation member 260.

By this constitution, the organic light emitting diode (OLED) display 102 of FIG. 11 may effectively suppress the penetration of the moisture and oxygen. Also, in the case of the embodiment shown in FIG. 11, the organic light emitting diode (OLED) display 102 may be easily manufactured.

Next, a manufacturing method of an organic light emitting diode (OLED) display 102 according to an exemplary embodiment will be described with reference to FIGS. 12 to 15.

Firstly, a substrate 100 formed of a material such as glass, quartz, or ceramic is prepared. Also, an organic light emitting element 70 (shown in FIG. 1) is formed on the substrate 100.

Figure 12:
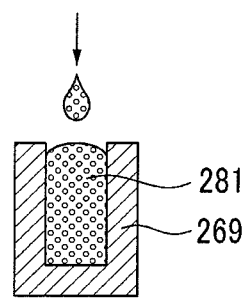
FIG. 12 to FIG. 15 are cross-sectional views sequentially showing a manufacturing process of the organic light emitting diode (OLED) display of FIG. 11.

Next, as shown in FIG. 12, a middle sealing member 269 having the embayment structure like the "U" shape is formed. The space between the one side and the other side forming the opening of the middle sealing member 269 is filled with the getter 281. The getter 281 may be filled in a liquid state. Also, in the embodiment shown in FIG. 12, the middle sealing member 269 forms a receiving space, and thereby the getter 281 in the liquid state may be stably filled.

Figure 13:
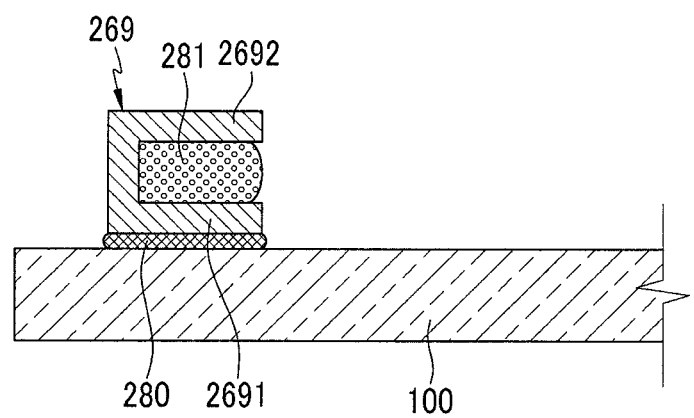

Next, as shown in FIG. 13, a first sealant 280 is coated at an edge portion of the substrate 100 to enclose the organic light emitting element 70. Also, one side 2691 of the middle sealing member 269 is sealed and combined to the substrate 100 by using the first sealant 280.

Figure 14:
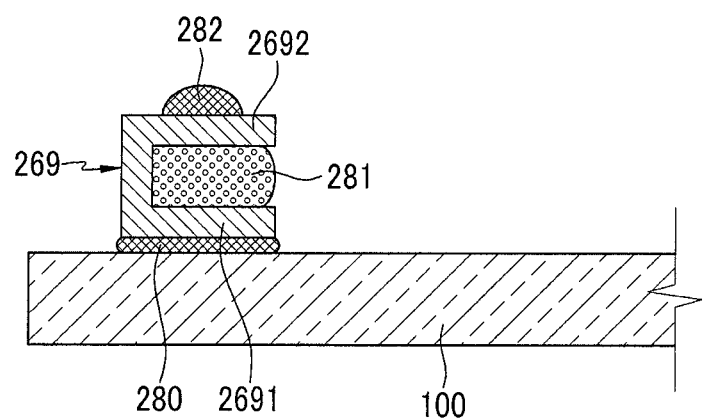
Figure 15:
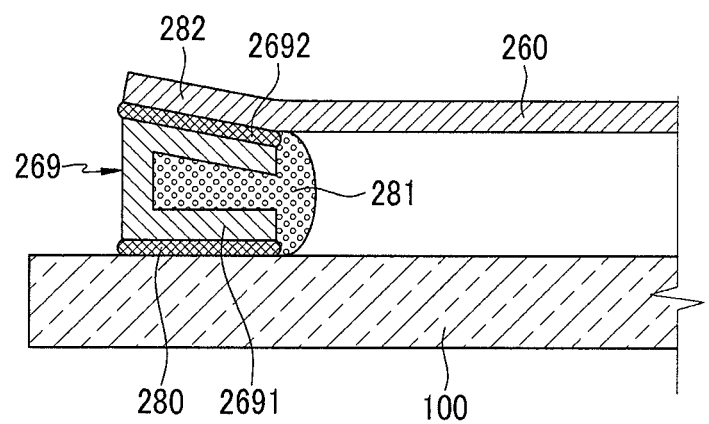

Next, as shown in FIG. 14, a second sealant 282 is coated on the other side 2692 of the middle sealing member 269. As shown in FIG. 15, the encapsulation member 260 is sealed and combined on the other side 2692 of the middle sealing member 269 by using the second sealant 282. Accordingly, the substrate 100 and the encapsulation member 260 are sealed and combined, thereby forming the sealing region between the substrate 100 and the encapsulation member 260.

In addition, the getter 281 receives pressure in the process of sealing and combining the substrate 100 and the encapsulation member 260 such that a portion thereof is protruded in the direction of the organic light emitting element 70. The protruded getter 281 is formed to respectively contact the substrate 100 and the encapsulation member 260. Accordingly, the getter 281 is positioned closer to the organic light emitting element 70 than the first sealant 280 and the second sealant 282. Thus, the getter 281 may secondarily prevent the moisture or oxygen from penetrating into the interface between the first sealant 280 and the substrate 100, or the interface between the second sealant 282 and the encapsulation member 260.

Here, the described manufacturing method of the organic light emitting diode (OLED) display 102 of FIGS. 12 to 15 may further easily manufacture the organic light emitting diode (OLED) display 102 while effectively suppressing the penetration of the moisture and oxygen.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of Symbols> | |
| --- | --- |
| 70: organic light emitting element | |
| 101: organic light emitting diode (OLED) display | |
| 100: substrate | 260: encapsulation member |
| 265: middle sealing member | 280: first sealant |
| 281: getter | 282: second sealant |

What is claimed is:

1. An organic light emitting diode (OLED) display comprising:
    a substrate;
    an encapsulation member having an interior side and an exterior side;
    an organic light emitting element between the substrate and the encapsulation member:
    the interior side of the encapsulation member facing the organic light emitting component and the exterior side of the encapsulation member facing away from the organic light emitting component;
    a middle sealing member comprising a first side between the substrate and the encapsulation member and a second side extended from the first side to be bent and enclosing an edge of the encapsulation member;
    a first sealant between and sealing the first side of the middle sealing member and the substrate
    a second sealant between and sealing the second side of the middle sealing member and the exterior side of the encapsulation member; and
    a getter between the first side of the middle sealing member and the interior side of the encapsulation member.

2. The organic light emitting diode (OLED) display of claim 1, wherein the getter is positioned closer to the organic light emitting element than the first sealant.

3. The organic light emitting diode (OLED) display of claim 1, wherein the getter maintains a vacuum state of a space between the substrate and the encapsulation member.

4. The organic light emitting diode (OLED) display of claim 1, wherein the first side of the sealing member between the substrate and the encapsulation member faces the same direction as the exterior side of the encapsulation member.

5. The organic light emitting diode (OLED) display of claim 1, wherein the middle sealing member is indirectly connected to the substrate.

6. The organic light emitting diode (OLED) display of claim 1, wherein the middle sealing member is indirectly connected to the encapsulation member.

* * * * *